(12) United States Patent
Nishimori

(10) Patent No.: US 7,253,679 B2
(45) Date of Patent: Aug. 7, 2007

(54) OPERATIONAL AMPLIFIER AND METHOD FOR CANCELING OFFSET VOLTAGE OF OPERATIONAL AMPLIFIER

(75) Inventor: Eiji Nishimori, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 135 days.

(21) Appl. No.: 11/225,188

(22) Filed: Sep. 14, 2005

(65) Prior Publication Data

US 2006/0202750 A1 Sep. 14, 2006

(30) Foreign Application Priority Data

Mar. 9, 2005 (JP) .............................. 2005-065686

(51) Int. Cl.
*H03F 1/02* (2006.01)
(52) U.S. Cl. .......................................... 330/9; 330/253
(58) Field of Classification Search .................... 330/9, 330/253, 257, 260, 258, 261
See application file for complete search history.

(56) References Cited

U.S. PATENT DOCUMENTS 6,400,219 B1 * 6/2002 Fayed ............................ 330/9

| 6,586,990 B2 * | 7/2003 | Udo et al. ...................... 330/9 |
| 7,081,792 B2 * | 7/2006 | Kasai et al. .................... 330/9 |

FOREIGN PATENT DOCUMENTS

| JP | 08-018353 | 1/1996 |
| JP | 2001-292041 | 10/2001 |

* cited by examiner

Primary Examiner—Henry Choe
(74) Attorney, Agent, or Firm—Arent Fox LLP

(57) ABSTRACT

An operational amplifier that cancels offset voltage while enabling its gain to be set to any value. The operational amplifier includes a first switch for short-circuiting the gates of two transistors in a first differential input unit. A capacitor is connected to the gates of two transistors in a second differential input unit, which is connected in parallel to the first differential input unit. The capacitor holds offset voltage derived from output voltage generated by an operational amplifier circuit. The capacitor generates a potential difference between the gates of the transistors in the second differential input unit to cancel the offset voltage.

4 Claims, 5 Drawing Sheets

OPERATIONAL AMPLIFIER AND METHOD FOR CANCELING OFFSET VOLTAGE OF OPERATIONAL AMPLIFIER

CROSS-REFERENCE TO RELATED APPLICATIONS

This application is based upon and claims the benefit of priority from the prior Japanese Patent Application No. 2005-065686, filed on Mar. 9, 2005, the entire contents of which are incorporated herein by reference.

BACKGROUND OF THE INVENTION

The present invention relates to an operational amplifier, and more particularly, to a method for canceling offset voltage of an operational amplifier.

A plurality of operational amplifiers for amplifying analog signals or differential signals are incorporated in an LSI as its basic circuits. The output signal of an operational amplifier includes an error (offset voltage) resulting from characteristic differences between transistors. With such an error, an operational amplifier cannot produce an output signal of 0 V even if the input signal is 0 V. Such an error in the output signal with respect to the input signal is referred to as an offset voltage. As shown in FIG. 1, the offset voltage is expressed as a voltage supply 2, which is connected to an input terminal of an operational amplifier 1.

When an input voltage Vin is applied, an output voltage Vo of the operational amplifier 1 is determined by the value of an input resistor R1 and the value of a feedback resistor R2. The output voltage Vo is calculated using the expression:

$$Vo = (1 + R2/R1) \times Vin.$$

In reality, however, the voltage supply 2 shown in FIG. 1 adds an offset voltage e1 to the input voltage Vin. Thus, the output voltage Vo is set as:

$$Vo = (1 + R2/R1) \times (Vin - e1).$$

In this way, the offset voltage e1 is also amplified and included in the output voltage Vo. When the input voltage Vin is small, the influence of the offset voltage e1 on the output voltage Vo increases.

A method for canceling such offset voltage of an operational amplifier has been proposed. In this method, an output voltage generated by short-circuiting two input terminals of the operational amplifier is held as an offset voltage, and the held offset voltage is fed back to the input of the operational amplifier.

In one example, Japanese Laid-Open Patent Publication No. 8-18353 describes an operational amplifier including a main amplifier, an auxiliary amplifier, and a holding means. The auxiliary amplifier receives an output signal of the main amplifier and amplifies the signal in a direction opposite to the output signal. The holding means holds an output signal of the auxiliary amplifier and feeds back the held output signal to the main amplifier. In this operational amplifier, the offset voltage of the main amplifier is reduced to a fraction of the gain of the main amplifier.

As another example, Japanese Laid-Open Patent Publication No. 2001-292041 describes an operational amplifier. In the operational amplifier, voltage including an offset and amplified by an operational amplifier circuit is accumulated in a capacitor device. A voltage value of the operational amplifier circuit is feedback-controlled based on the accumulated voltage.

SUMMARY OF THE INVENTION

The operational amplifier described in Japanese Laid-Open Patent Publication No. 8-18353 feeds back the offset voltage of the auxiliary amplifier to the input terminal of the main amplifier, adds the offset voltage of the main amplifier to the offset voltage of the auxiliary amplifier, and reduces the offset voltage of the main amplifier to a fraction of the gain of the main amplifier. Accordingly, the reduced offset voltage affects the output voltage of the operational amplifier.

The operational amplifier described in Japanese Laid-Open Patent Publication No. 2001-292041 feeds back the offset voltage accumulated in the capacitor device to a second inversion input terminal of the operational amplifier, which is used to for offset adjustment. This feedback control is applicable only to operational amplifiers of which the amplification factor is 1. In other words, this feedback control is not applicable to operational amplifiers of which the amplification factor is greater than 1.

The present invention provides an operational amplifier that cancels offset voltage while enabling its gain to be set to any value.

One aspect of the present invention is an operational amplifier including an input terminal and an output terminal connected to the input terminal for outputting output voltage. An operational amplifier circuit includes a current mirror, having a first pair of transistors, and a first differential input unit, having a second pair of transistors connected to the current mirror. An offset adjustment circuit includes a second differential input unit having a third pair of transistors connected to the current mirror. A first switch switches between a first connection point, in which a gate of one of the second pair of transistors is connected to a gate of the other one of the second pair of transistors, and a second connection point, in which the gate of the one of the second pair of transistors is connected to the input terminal. A second switch switches between a connection state, in which a gate of one of the third pair of transistors is connected to the input terminal, and a disconnection state, in which the gate of the one of the third pair of transistors is disconnected from the input terminal. An offset voltage holding unit, connected to gates of the third pair of transistors, holds an offset voltage derived from output voltage generated by the operational amplifier circuit when the first switch is switched to the first connection point and the second switch is switched to the connection state. The offset voltage holding unit generates a potential difference between the gates of the third pair of transistors in accordance with the held offset voltage when the first switch is switched to the second connection point and the second switch is switched to the disconnection state.

A further aspect of the present invention is an operational amplifier including a first input terminal, a second input terminal, and an output terminal connected to one of the first and second input terminals for outputting output voltage. An operational amplifier circuit includes a current mirror, having a first pair of transistors, and a first differential input unit, having a second pair of transistors connected to the current mirror. An offset adjustment circuit includes a second differential input unit having a third pair of transistors connected to the current mirror. A first switch switches between a first connection point, in which a gate of one of the second pair of transistors is connected to a gate of the other one of the second pair of transistors, and a second connection point, in which the gate of the one of the second pair of transistors is connected to the first input terminal. A second switch switches between a first connection state, in which a gate of a first one of the third pair of transistors is connected to the first input terminal, and a first disconnection state, in which the gate of the first one of the third pair of transistors is disconnected from the first input terminal. A third switch switches between a second connection state, in which a gate of a second one of the third pair of transistors is connected to the second input terminal, and a second disconnection state, in which the gate of the second one of the third pair of transistors is disconnected from the second input terminal. An offset voltage holding unit, connected to the gates of the third pair of transistors, holds an offset voltage derived from output voltage generated by the operational amplifier circuit when the first switch is switched to the first connection point, the second switch is switched to the first connection state, and the third switch is switched to the second connection state. The offset voltage holding unit generates a potential difference between the gates of the third pair of transistors in accordance with the held offset voltage when the first switch is switched to the second connection point, the second switch is switched to the first disconnection state, and the third switch is switched to the second disconnection state.

Another aspect of the present invention is a method for canceling offset voltage derived from output voltage of an operational amplifier. The operational amplifier includes an input terminal. An output terminal is connected to the input terminal for outputting the output voltage. An operational amplifier circuit is provided with a current mirror, having a first pair of transistors, and a first differential input unit, having a second pair of transistors connected to the current mirror. An offset adjustment circuit is provided with a second differential input unit having a third pair of transistors connected to the current mirror. An offset voltage holding unit is connected to gates of the third pair of transistors for holding the offset voltage. The method includes holding the offset voltage with the offset voltage holding unit by connecting a gate of one of the second pair of transistors to a gate of the other one of the second pair of transistors and connecting a gate of one of the third pair of transistors to the input terminal, and generating a potential difference between the gates of the third pair of transistors in accordance with the held offset voltage to cancel the offset voltage by connecting the gate of the one of the second pair of transistors to the input terminal and disconnecting the gate of the one of the third pair of transistors from the input terminal.

A further aspect of the present invention is a method for canceling offset voltage derived from output voltage of an operational amplifier. The operational amplifier includes a first input terminal, a second input terminal, and an output terminal connected to one of the first and second input terminals for outputting output voltage. An operational amplifier circuit is provided with a current mirror, having a first pair of transistors, and a first differential input unit, having a second pair of transistors connected to the current mirror. An offset adjustment circuit is provided with a second differential input unit having a third pair of transistors connected to the current mirror. An offset voltage holding unit is connected to the gates of the third pair of transistors for holding the offset voltage. The method includes holding the offset voltage with the offset voltage holding unit by connecting a gate of one of the second pair of transistors to a gate of the other one of the second pair of transistors and connecting gates of the third pair of transistors respectively to the first and second input terminals, and generating a potential difference between the gates of the third pair of transistors in accordance with the held offset voltage to cancel the offset voltage by connecting the gate of the one of the second pair of transistors to the first input terminal and disconnecting the gates of the third pair of transistors from the first and second input terminals.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
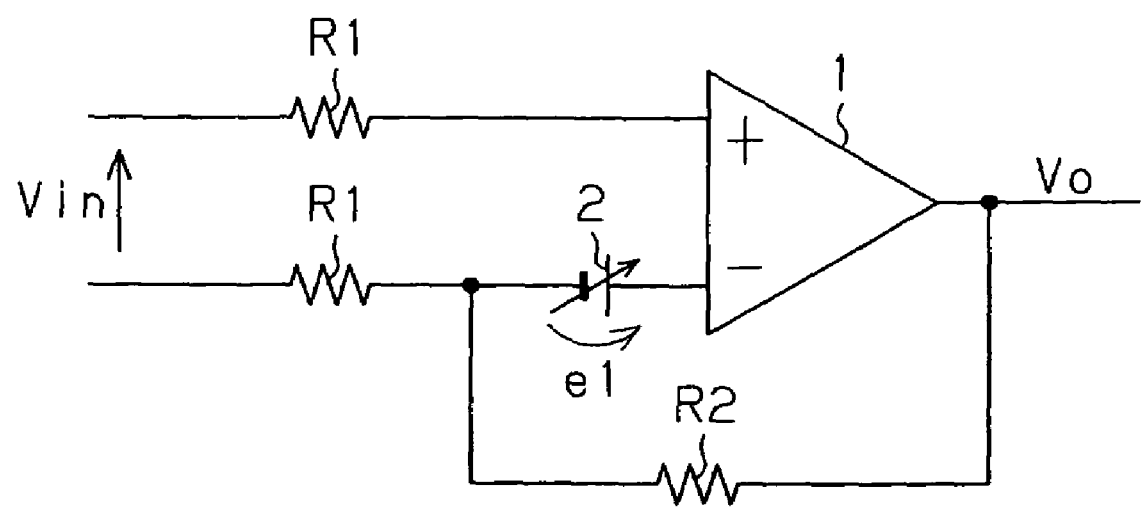
FIG. 1 is an equivalent circuit diagram of an operational amplifier in the prior art.

In the drawings, like numerals are used for like elements throughout.

An operational amplifier 11 according to a first embodiment of the present invention will now be described with reference to FIGS. 2 to 4.

Figure 2:
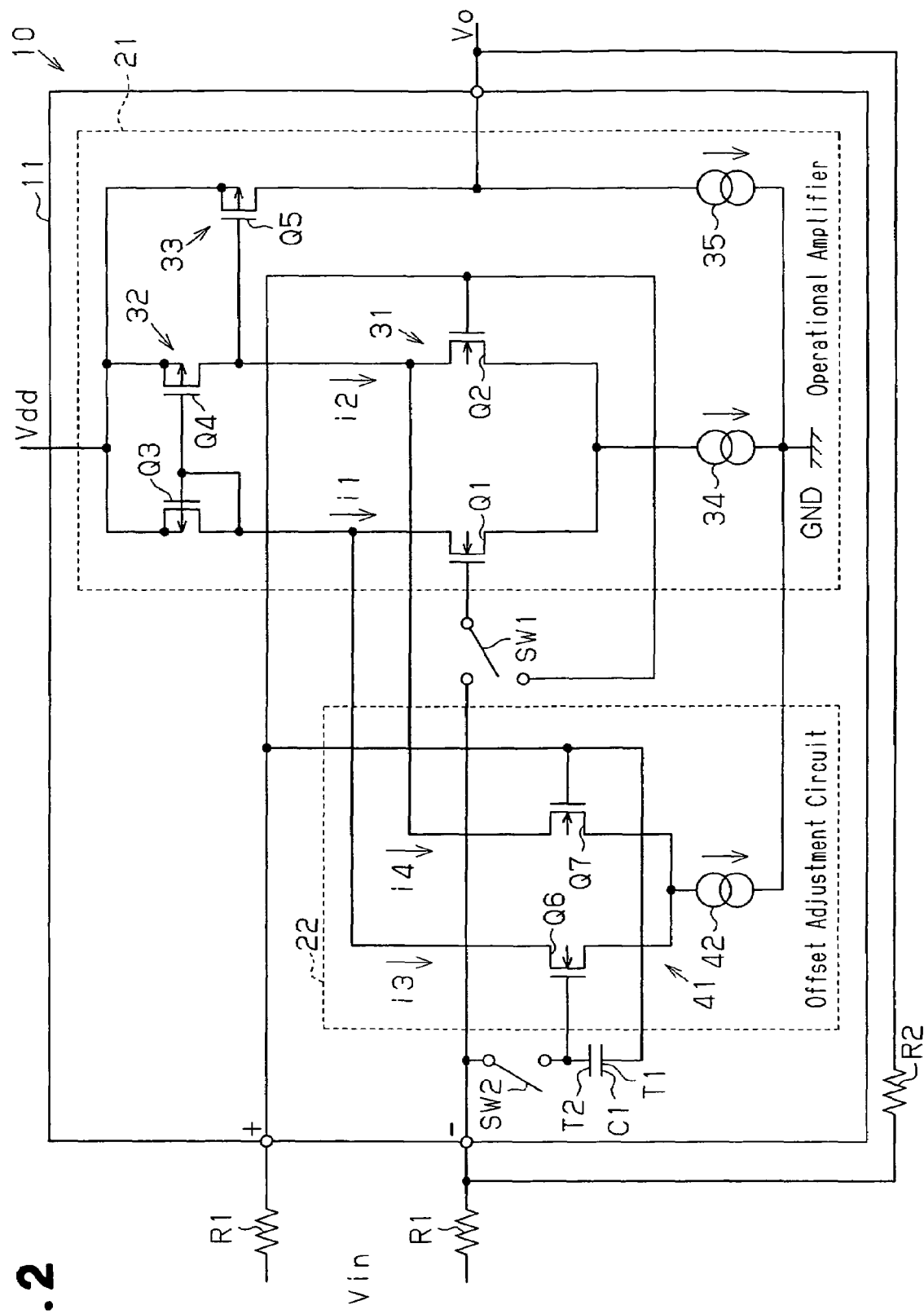
FIG. 2 is a schematic circuit diagram of an inversion amplifier circuit including an operational amplifier according to a first embodiment of the present invention.

Referring to FIG. 2, the operational amplifier 11 is included in an inversion amplifier circuit 10. The inversion amplifier circuit 10 includes the operational amplifier 11, two input resistors R1, and one feedback resistor R2. The operational amplifier 11 has a non-inversion input terminal (indicated by a "+" in the drawing), an inversion input terminal (indicated by a "−" in the drawing), and an output terminal. The non-inversion input terminal and the inversion input terminal are respectively connected to the two input resistors R1. The output terminal is connected to the inversion input terminal via the feedback resistor R2. The operational amplifier 11 amplifies an input voltage Vin (potential difference between the two input terminals) in accordance with gain (amplification factor), which is determined by the values of the input resistors R1 and the feedback resistor R2, to generate an output voltage Vo.

The operational amplifier 11 includes an operational amplifier circuit 21 and an offset adjustment circuit 22.

The operational amplifier circuit 21 includes a first differential input unit 31, a current mirror 32, and an output unit 33. The differential input unit 31 is configured by two transistors Q1 and Q2. Each of the transistors Q1 and Q2 is an N-channel MOS (metal oxide semiconductor) transistor.

The sources of the transistors Q1 and Q2 are connected to each other. A connection node of the sources of the transistors Q1 and Q2 is connected to a low-potential power supply (in this case, ground GND) via a constant current supply 34. The gate of the first transistor Q1 is connected to the inversion input terminal of the operational amplifier 11. The gate of the second transistor Q2 is connected to the non-inversion input terminal of the operational amplifier 11. The drains of the transistors Q1 and Q2 are connected to the current mirror 32.

The current mirror 32 is configured by two transistors Q3 and Q4. Each of the transistors Q3 and Q4 is a P-channel MOS transistor. The drain of the transistor Q3 is connected to the drain of the transistor Q1. The drain of the transistor Q4 is connected to the drain of the transistor Q2. The sources of the transistors Q3 and Q4 are connected to a high-potential power supply Vdd. The gates of the transistors Q3 and Q4 are connected to each other and to the drain of the transistor Q3.

A node between the transistors Q4 and Q2 is connected to the gate of a transistor Q5, which functions as the output unit 33. The transistor Q5, which is a P-channel MOS transistor, includes a source connected to the high-potential power supply Vdd and a drain connected to the low-potential power supply via a constant current supply 35.

The offset adjustment circuit 22 includes a second differential input unit 41 and a constant current supply 42, which are connected in parallel to the differential input unit 31 and the constant current supply 35 of the operational amplifier circuit 21. The second differential input unit 41 is configured by two transistors Q6 and Q7. Each of the transistors Q6 and Q7 is an N-channel MOS transistor. The sources of the transistors Q6 and Q7 are connected to each other. A connection node of the sources of the transistors Q6 and Q7 is connected to the low-potential power supply via the constant current supply 42. The gate of the transistor Q6 is connected to the inversion input terminal of the operational amplifier 11. The gate of the transistor Q7 is connected to the non-inversion input terminal of the operational amplifier 11. The drains of the transistors Q6 and Q7 are connected to the current mirror 32. In other words, the drain of the transistor Q6 is connected to the drain of the transistor Q3, and the drain of the transistor Q7 is connected to the drain of the transistor Q4. A capacitor C1 has an electrode T1, which is connected to the gate of the transistor Q7 and the non-inversion input terminal, and an electrode T2, which is connected to the gate of the transistor Q6.

A first switch SW1 is connected between the gate of the transistor Q1 and the inversion input terminal. The first switch SW1 has a common terminal connected to the gate of the transistor Q1, a first terminal connected to the inversion input terminal, and a second terminal connected to the gate of the transistor Q2, or the non-inversion input terminal. The first switch SW1 is switched in a manner that its common terminal is connected to its second terminal during offset adjustment of the operational amplifier 11, and its common terminal is connected to its first terminal during normal operation in which offset cancellation of the operational amplifier 11 is validated.

A second switch SW2 is connected between the gate of the transistor Q6, the electrode T2 of the capacitor C1, and the inversion input terminal. The second switch SW2 is activated during offset adjustment of the operational amplifier 11 and inactivated during normal operation in which offset cancellation of the operational amplifier 11 is validated.

The operation of the operational amplifier 11 will now be described.

[Offset Adjustment]

The first switch SW1 operates in a manner that the gate of the first transistor Q1 and the gate of the second transistor Q2 are short-circuited. In other words, the two input terminals of the operational amplifier circuit 21 are short-circuited. The second switch SW2 operates in a manner that the gate of the transistor Q6 and the capacitor C1 are connected to the inversion input terminal via the second switch SW2. An output voltage of the operational amplifier circuit 21 is fed back to the gate of the transistor Q6 in the offset adjustment circuit 22. In this state, the capacitor C1 is connected between the gate of the transistor Q6 and the gate of the transistor Q7 in the offset adjustment circuit 22.

Accordingly, the same voltage is applied to the gate of the transistor Q1 and the gate of the transistor Q2 in the operational amplifier circuit 21 so that currents i1 and i2 having substantially the same value respectively flow through the transistors Q1 and Q2. When the operational amplifier circuit 21 and the offset adjustment circuit 22 generate an offset voltage, in accordance with the offset voltage, a difference occurs between current i3 flowing through the transistor Q6 and current i4 flowing through the transistor Q7 in the offset adjustment circuit 22. The difference between the gate voltage of the transistor Q6 and the gate voltage of the transistor Q7 is substantially equal to the offset voltage. Thus, the capacitor C1 accumulates charge in a manner that the potential difference between the two gate electrodes is substantially equal to the offset voltage in the operational amplifier circuit 21 and the offset adjustment circuit 22. In other words, the capacitor C1 functions as an offset voltage holding unit for holding the offset voltage.

Figure 3:
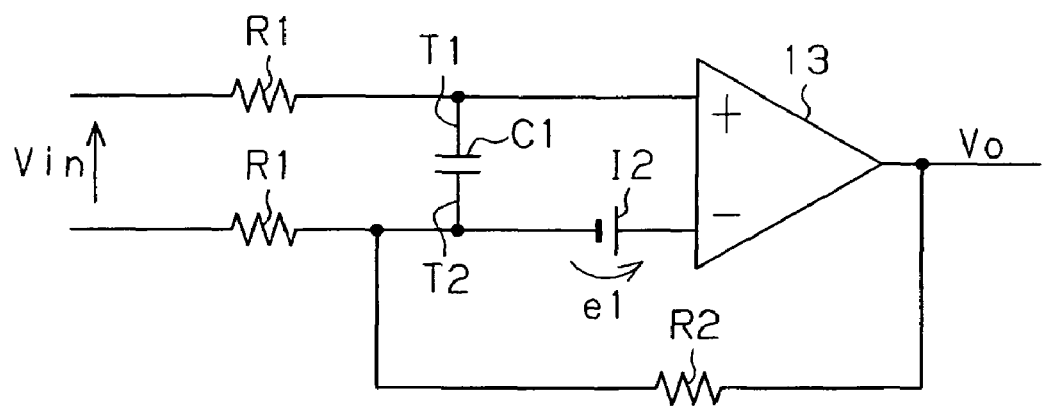
FIG. 3 is an equivalent circuit diagram showing the inversion amplifier circuit of FIG. 2 during offset adjustment.
Figure 4:
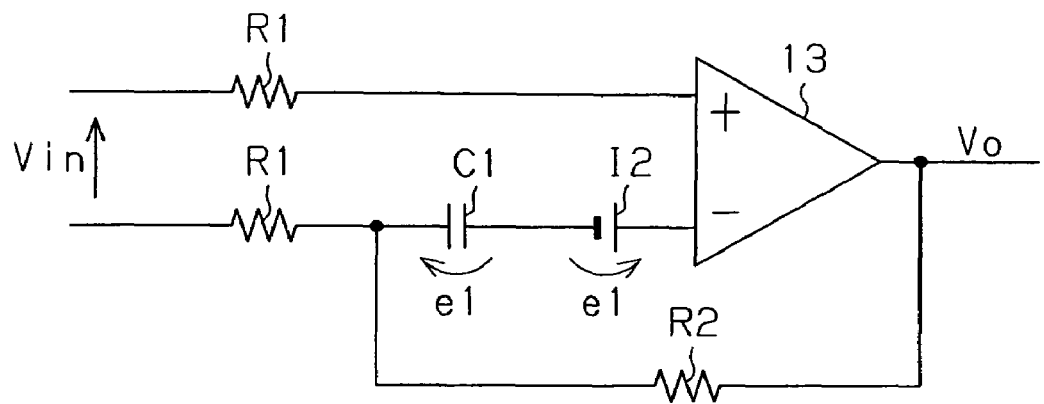
FIG. 4 is an equivalent circuit diagram showing the inversion amplifier circuit of FIG. 2 during offset cancellation.

FIG. 3 shows an equivalent circuit of the inversion amplifier circuit 10 during offset adjustment. The equivalent circuit shows an operational amplifier 13 that is an ideal operational amplifier having no offset voltage. A voltage supply I2 generates an offset voltage e1 of the operational amplifier 11. When the input voltage is Vin in FIG. 3, the output voltage Vo is set as:

$$Vo=(1+(R2/R1))\times(Vin-e1).$$

In FIG. 3, a capacitor C1 has an electrode T1, which is connected to a non-inversion input terminal of the operational amplifier 13, and an electrode T2, which is connected to an inversion input terminal of the operational amplifier 13. Voltage that is higher than the voltage at the inversion input terminal by a value of the input voltage Vin is applied to the electrode T1. Voltage Vc1, which is obtained by dividing the output voltage Vo of the operational amplifier 11 and the voltage at the inversion input terminal with the input resistors R1 and a feedback resistor R2, is applied to the electrode T2. The voltage Vc1 is set as:

$$Vc1=(R1/(R1+R2))\times Vo=Vin-e1.$$

The voltage at the electrode T1 of the capacitor C1 is higher than the voltage at the electrode T2 by the value of the input voltage Vin. Thus, the potential difference between the electrodes T1 and T2 of the capacitor C1 is substantially equal to the offset voltage e1. In other words, the capacitor C1 is charged in a manner that the potential difference between the electrodes T1 and T2 becomes substantially equal to the offset voltage e1.

[Offset Cancellation]

Referring again to FIG. 2, during normal operation of the operational amplifier 11, the offset adjustment circuit 22 cancels the offset voltage of the operational amplifier 11. To start offset cancellation, the first switch SW1 connects the gate of the transistor Q1 to the inversion input terminal, and the second switch SW2 disconnects the gate of the transistor Q6 and the electrode T2 of the capacitor C1 from the inversion input terminal.

The operation of the inversion amplifier circuit 10 during offset cancellation will now be described with reference to the equivalent circuit shown in FIG. 4. In this equivalent circuit, a capacitor C1 is connected in series to a voltage supply I2. The capacitor C1 has a potential difference e1 in the direction opposite to the offset voltage e1. Thus, the potential difference e1 generated by the charge accumulated in the capacitor C1 cancels the offset voltage e1 of the voltage supply I2. The operational amplifier 13 is supplied with the input voltage Vin from which the offset voltage has been canceled.

The operational amplifier 11 of the first embodiment has the advantages described below.

During offset adjustment, the first switch SW1 short-circuits the gates of the transistors Q1 and Q2 in the first differential input unit 31 so that the capacitor C1, which is connected to the gates of the transistors Q6 and Q7 in the second differential input unit 41, holds the offset voltage e1 included in the output voltage Vo, which is generated by the operational amplifier circuit 21. During offset cancellation, the potential difference that is in accordance with the offset voltage e1 held by the capacitor C1 is generated at the gates of the transistors Q6 and Q7. The capacitor C1 holds the offset voltage e1 and generates a potential difference in the direction opposite to the offset voltage e1. This enables the gain of the operational amplifier 11 to be set to any value and cancels the offset voltage e1 irrespective of the gain.

An operational amplifier 51 according to a second embodiment of the present invention will now be described with reference to FIGS. 5 to 7.

Figure 5:
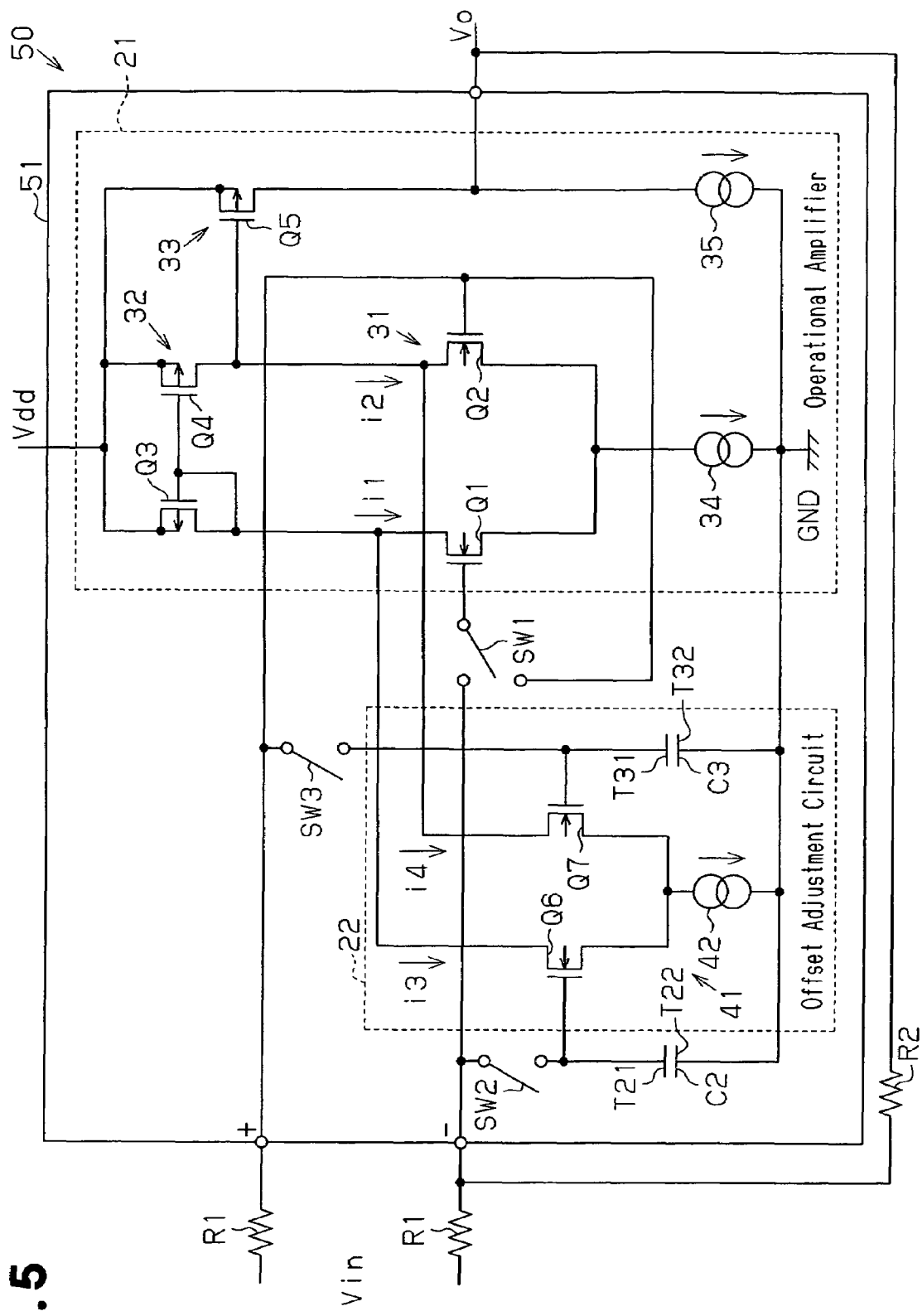
FIG. 5 is a schematic circuit diagram of an inversion amplifier circuit including an operational amplifier according to a second embodiment of the present invention.

As shown in FIG. 5, the operational amplifier 51 is included in an inversion amplifier circuit 50. The inversion amplifier circuit 50 includes the operational amplifier 51, two input resistors R1, and one feedback resistor R2. The operational amplifier 51 includes an operational amplifier circuit 21 and an offset adjustment circuit 22. A first switch SW1 is connected between a gate of a transistor Q1, which is included in the operational amplifier circuit 21, and an inversion input terminal of the operational amplifier 51. A second switch SW2 is connected between the gate of a transistor Q6, which is included in the offset adjustment circuit 22, and the inversion input terminal.

A third switch SW3 is connected between the gate of a transistor Q7, which is included in the offset adjustment circuit 22, and a non-inversion input terminal of the operational amplifier 51. The third switch SW3 is activated during offset adjustment of the operational amplifier 51 and inactivated during offset cancellation of the operational amplifier 51.

A first electrode T21 of a capacitor C2 is connected to the gate of the transistor Q6. A second electrode T22 of the capacitor C2 is connected to a reference potential power supply (in this case, ground GND). A first electrode T31 of a capacitor C3 is connected to the gate of the transistor Q7. A second electrode T32 of the capacitor C3 is connected to the reference potential power supply (ground GND).

In the second embodiment, during offset adjustment, the capacitor C2 holds the voltage at the inversion input side of the capacitor C1 of the first embodiment as an absolute value, and the capacitor C3 holds the voltage at the non-inversion input side of the capacitor C1 as an absolute value.

Figure 6:
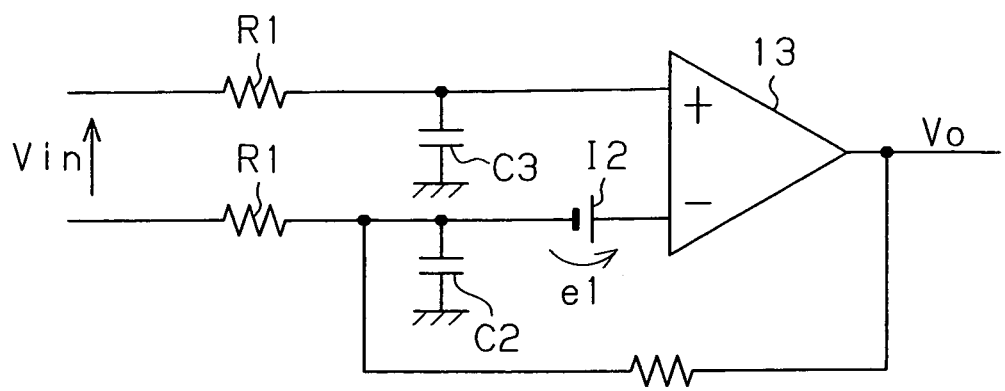
FIG. 6 is an equivalent circuit diagram showing the inversion amplifier circuit of FIG. 5 during offset adjustment.

That is, the inversion amplifier circuit 50 during offset adjustment is expressed as the equivalent circuit shown in FIG. 6.

Figure 7:
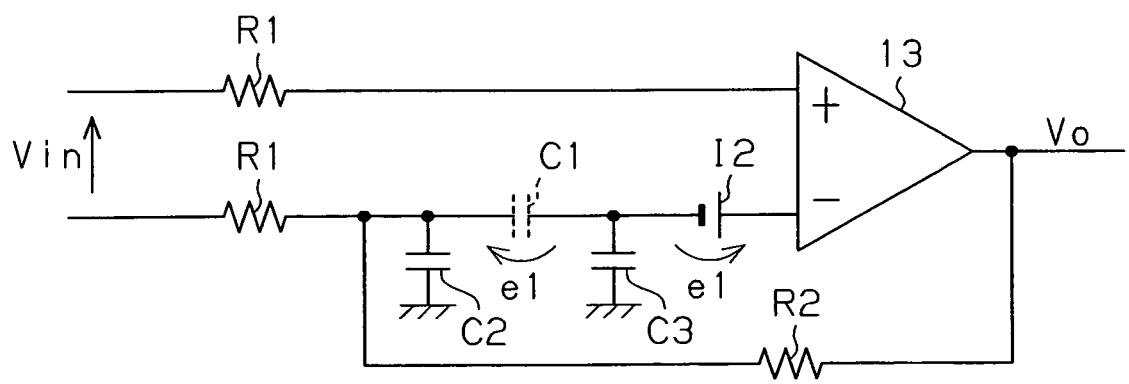
FIG. 7 is an equivalent circuit diagram of the inversion amplifier circuit of FIG. 5 during offset cancellation.

During offset cancellation, the inversion amplifier circuit 50 operates as the equivalent circuit shown in FIG. 7. In this state, the charge accumulated in the capacitors C2 and C3 cancels the offset voltage e1 in the same manner as the charge accumulated in the capacitor C1 indicated by broken lines in FIG. 7.

In the operational amplifier 51, during normal operation (offset cancellation), the capacitor C2 is disconnected from the inversion input terminal and the capacitor C3 is disconnected from the non-inversion input terminal. Thus, the gate voltages of the transistors Q6 and Q7 included in the offset adjustment circuit 22 are not affected by the input voltage Vin. This prevents the gate voltages of the transistors Q6 and Q7 from being varied by the input voltage Vin.

Because of its configuration, a capacitor may have a slight leakage that occurs in one of its two electrodes. Thus, the electrodes of the capacitors C2 and C3 at which leakage does not occur are connected to the gates of the transistors Q6 and Q7. As a result, the transistors Q6 and Q7 are subtly affected by a leakage.

The operational amplifier 51 of the second embodiment has the advantages described below.

(1) In the operational amplifier 51, during normal operation (offset cancellation), the second switch SW2 disconnects the capacitor C2 from the inversion input terminal, and the third switch SW3 disconnects the capacitor C3 from the non-inversion input terminal. Thus, the gate voltage of the transistor Q6 and the gate voltage of the transistor Q7 in the offset adjustment circuit 22 are not affected by the input voltage Vin. This prevents the gate voltages of the transistors Q6 and Q7 from being varied by the input voltage Vin.

(2) Because of its configuration, a capacitor may have a slight leakage that occurs in one of its two electrodes. Thus, the electrodes of the capacitors C2 and C3 at which leakage does not occur are connected to the gates of the transistors Q6 and Q7. As a result, the transistors Q6 and Q7 are subtly affected by a leakage.

It should be apparent to those skilled in the art that the present invention may be embodied in many other specific forms without departing from the spirit or scope of the invention. Particularly, it should be understood that the present invention may be embodied in the following forms.

In the second embodiment, the capacitor C1 of the first embodiment may be connected between the gates of the transistors Q6 and Q7 in the offset adjustment circuit 22. In this case, the charge accumulated in the capacitors C1, C2, and C3 cancels the offset voltage e1. This reduces the size of each of the capacitors C1 to C3.

The second switch SW2 may be connected to the non-inversion input terminal instead of the inversion input terminal.

The first switch SW1 may be configured by a plurality of switches.

To improve offset correction accuracy, the voltage-current conversion gain gm of each of the transistors Q6 and Q7 may be lowered. The conversion gain gm may be lowered by, for example, increasing the gate length of each of the transistors Q6 and Q7. By lowering the conversion gain gm in this manner, the value, or size, of the capacitor holding the offset voltage may be reduced.

The present examples and embodiments are to be considered as illustrative and not restrictive, and the invention is not to be limited to the details given herein, but may be modified within the scope and equivalence of the appended claims.

What is claimed is:

1. An operational amplifier comprising:
an input terminal and an output terminal connected to the input terminal for outputting output voltage;
an operational amplifier circuit including a current mirror, having a first pair of transistors, and a first differential input unit, having a second pair of transistors connected to the current mirror;
an offset adjustment circuit including a second differential input unit having a third pair of transistors connected to the current mirror;
a first switch for switching between a first connection point, in which a gate of one of the second pair of transistors is connected to a gate of the other one of the second pair of transistors, and a second connection point, in which the gate of the one of the second pair of transistors is connected to the input terminal;
a second switch for switching between a connection state, in which a gate of one of the third pair of transistors is connected to the input terminal, and a disconnection state, in which the gate of the one of the third pair of transistors is disconnected from the input terminal; and
an offset voltage holding unit, connected to gates of the third pair of transistors, for holding an offset voltage derived from output voltage generated by the operational amplifier circuit when the first switch is switched to the first connection point and the second switch is switched to the connection state, the offset voltage holding unit generating a potential difference between the gates of the third pair of transistors in accordance with the held offset voltage when the first switch is switched to the second connection point and the second switch is switched to the disconnection state.

2. The operational amplifier according to claim 1, wherein the offset voltage holding unit includes a capacitor connected between the gates of the third pair of transistors.

3. A method for canceling offset voltage derived from output voltage of an operational amplifier, wherein the operational amplifier includes an input terminal, an output terminal connected to the input terminal for outputting the output voltage, an operational amplifier circuit provided with a current mirror, having a first pair of transistors, and a first differential input unit, having a second pair of transistors connected to the current mirror, an offset adjustment circuit provided with a second differential input unit having a third pair of transistors connected to the current mirror, and an offset voltage holding unit connected to gates of the third pair of transistors for holding the offset voltage, the method comprising:
holding the offset voltage with the offset voltage holding unit by connecting a gate of one of the second pair of transistors to a gate of the other one of the second pair of transistors and connecting a gate of one of the third pair of transistors to the input terminal; and
generating a potential difference between the gates of the third pair of transistors in accordance with the held offset voltage to cancel the offset voltage by connecting the gate of the one of the second pair of transistors to the input terminal and disconnecting the gate of the one of the third pair of transistors from the input terminal.

4. The method according to claim 3, wherein the offset voltage holding unit includes a capacitor connected between the gates of the third transistors, and said holding the offset voltage includes holding the offset voltage with the capacitor.

* * * * *